United States Patent
Chattopadhyay et al.

(10) Patent No.: US 7,203,036 B2
(45) Date of Patent: Apr. 10, 2007

(54) PLANAR EXTRAORDINARY MAGNETORESISTANCE SENSOR

(75) Inventors: Amitava Chattopadhyay, San Jose, CA (US); Robert E. Fontana, Jr., San Jose, CA (US); Bruce A. Gurney, San Rafael, CA (US); Stefan Maat, San Jose, CA (US); Ernesto E. Marinero, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 435 days.

(21) Appl. No.: 10/909,122

(22) Filed: Jul. 30, 2004

(65) Prior Publication Data

US 2006/0022672 A1   Feb. 2, 2006

(51) Int. Cl.
*G11B 5/39*   (2006.01)
*G01R 33/02*   (2006.01)
*G01R 27/08*   (2006.01)

(52) U.S. Cl. .................. 360/313; 360/324.2; 360/319; 360/326; 360/324; 73/777; 257/421; 324/252; 338/32 R

(58) Field of Classification Search ................. 360/313, 360/318, 317, 324, 324.1, 324.11, 324.12, 360/324.2; 324/252; 257/421; 338/32 R
See application file for complete search history.

(56) References Cited

U.S. PATENT DOCUMENTS

| 5,717,547 | A   * | 2/1998  | Young ......................... 360/246 |
|-----------|-------|---------|----------------------------------|
| 5,724,315 | A   * | 3/1998  | Moffett et al. ............... 367/153 |
| 5,965,283 | A     | 10/1999 | Solin et al. |
| 6,246,102 | B1 * | 6/2001  | Sauerbrey et al. .......... 257/529 |
| 6,353,317 | B1    | 3/2002  | Green et al. |
| 6,633,463 | B1 * | 10/2003 | Inoue et al. ................. 360/320 |
| 6,650,513 | B2    | 11/2003 | Fullerton et al. |
| 6,707,122 | B1    | 3/2004  | Hines et al. |
| 6,713,389 | B2 * | 3/2004  | Speakman .................. 438/674 |
| 6,714,374 | B1    | 3/2004  | Hayashi et al. |
| 6,759,690 | B2 * | 7/2004  | Miller ......................... 257/103 |

(Continued)

FOREIGN PATENT DOCUMENTS

| JP | 2001223411 A | * | 8/2001 |
| JP | 2001223412 A | * | 8/2001 |

OTHER PUBLICATIONS

Solin, S.A. et al;Enhanced Room-Temperature Geometric Magnetoresistance in Inhomogeneous Narrow-Gap Semiconductors, The Magnetic Recording Conference, Aug. 20-22, 2001.*
Solin, S.A. et al; Enhanced Room-Temperature Geometric Magnetoresistance in Inhomogeneous Narrow-Gap Semiconductors Science vol. 289, Sep. 1, 2000.*

(Continued)

*Primary Examiner*—William Korzuch
*Assistant Examiner*—Matthew G. Kayrish
(74) *Attorney, Agent, or Firm*—Thomas R. Berthold

(57) ABSTRACT

An extraordinary magnetoresistance (EMR) sensor has a planar shunt and planar leads formed on top of the sensor and extending downward into the semiconductor active region, resulting. Electrically conductive material, such as Au or AuGe, is first deposited into lithographically defined windows on top of the sensor. After liftoff of the photoresist a rapid thermal annealing process causes the conductive material to diffuse downward into the semiconductor material and make electrical contact with the active region. The outline of the sensor is defined by reactive etching or other suitable etching techniques. Insulating backfilling material such as Al-oxide is deposited to protect the EMR sensor and the edges of the active region. Chemical mechanical polishing of the structure results in a planar sensor that does not have exposed active region edges.

23 Claims, 3 Drawing Sheets

U.S. PATENT DOCUMENTS

| | | |
|---|---|---|
| 6,781,176 B2 * | 8/2004 | Ramesh ..................... 257/295 |
| 6,794,965 B2 * | 9/2004 | Shen et al. ................... 335/78 |
| 6,809,515 B1 * | 10/2004 | Li et al. ...................... 324/260 |
| 6,930,862 B2 * | 8/2005 | Gill et al. ................... 360/313 |
| 2003/0099063 A1 * | 5/2003 | Takano et al. .............. 360/122 |
| 2003/0128478 A1 | 7/2003 | Gill et al. |
| 2004/0129087 A1 * | 7/2004 | Rowe et al. .................. 73/777 |
| 2004/0218309 A1 * | 11/2004 | Seigler ....................... 360/313 |

OTHER PUBLICATIONS

T. Zhou, et al. "Extraordinary magnetoresistance in externally shunted van der Pauw plates", Appl. Phys. Lett., vol. 78, No. 5, Jan. 29, 2001, pp. 667-669.

S. A. Solin et al., "Nonmagnetic semiconductors as read-head sensors for ultra-high-density magnetic recording", Appl. Phys. Lett., vol. 80, No. 21, May 27, 2002, pp. 4012-4014.

* cited by examiner

PLANAR EXTRAORDINARY MAGNETORESISTANCE SENSOR

BACKGROUND OF THE INVENTION

1. Field of the Invention

This invention relates generally to a magnetoresistive sensor, and more particularly to such a sensor based on extraordinary magnetoresistance (EMR).

2. Description of the Related Art

A magnetoresistive sensor based on extraordinary magnetoresistance (EMR) has been proposed as a read-head sensor for magnetic recording hard disk drives. Because the active region in the EMR sensor is formed of nonmagnetic semiconductor materials, the EMR sensor does not suffer from the problem of magnetic noise that exists in read-head sensors based on giant magnetoresistance (GMR) and tunneling magnetoresistance (TMR), both of which use magnetic films in their active regions.

The EMR sensor is fabricated as a mesa comprising a semiconductor heterostructure on a substrate. A pair of voltage leads and a pair of current leads are formed on one side of the mesa in contact with the semiconductor active region and an electrically conductive metal shunt is formed on the other side of the semiconductor mesa in contact with active region. In the absence of an applied magnetic field, injected current through the current leads passes into the semiconductor active region and is shunted through the metal. When an applied magnetic field is present, current is deflected from the shunt and travels a longer distance through the semiconductor active region. Because the semiconductor is much more resistive, the electrical resistance of the device increases. The change in electrical resistance due to the applied magnetic field is detected across the voltage leads. EMR is described by T. Zhou et al., "Extraordinary magnetoresistance in externally shunted van der Pauw plates", *Appl. Phys. Lett.*, Vol. 78, No. 5, 29 Jan. 2001, pp. 667–669. An EMR sensor for read-head applications is described by S. A. Solin et al., "Nonmagnetic semiconductors as read-head sensors for ultra-high-density magnetic recording", *Appl. Phys. Lett.*, Vol. 80, No. 21, 27 May 2002, pp. 4012–4014.

The EMR sensor as described in the prior art is difficult to fabricate because the lithography for the shunt and leads must be done on a nonplanar surface, i.e, the sides of the mesa. Moreover the contact area giving rise to the contact resistance is only defined by the thickness of the EMR active region and the lead width. For small sensors this contact area is small resulting in a high contact resistance and a loss in signal-to noise ratio. In addition, chemical changes of the active region by exposure to the environment can negatively impact the electrical properties of the active region.

What is needed is a planar EMR sensor with a shunt and leads that are patterned on top of the sensor and extend perpendicularly downward to provide electrical contact with the EMR active region to thereby improve the fabrication process and solve the problems of high lead contact resistance and exposure of the EMR active region to the environment.

SUMMARY OF THE INVENTION

The invention is an EMR sensor that has the shunt and leads formed on top of the sensor and extending downward into the active region, resulting in a planar sensor that does not have exposed active region edges. Electrically conductive material, such as Au or AuGe, is first deposited into lithographically defined windows on top of the sensor. After liftoff of the photoresist a rapid thermal annealing process causes the conductive material to diffuse downward into the semiconductor material and make electrical contact with the active region. A capping layer protects the sensor and the sensor edges.

For a fuller understanding of the nature and advantages of the present invention, reference should be made to the following detailed description taken together with the accompanying figures.

DETAILED DESCRIPTION OF THE INVENTION

Prior Art

Figure 1:
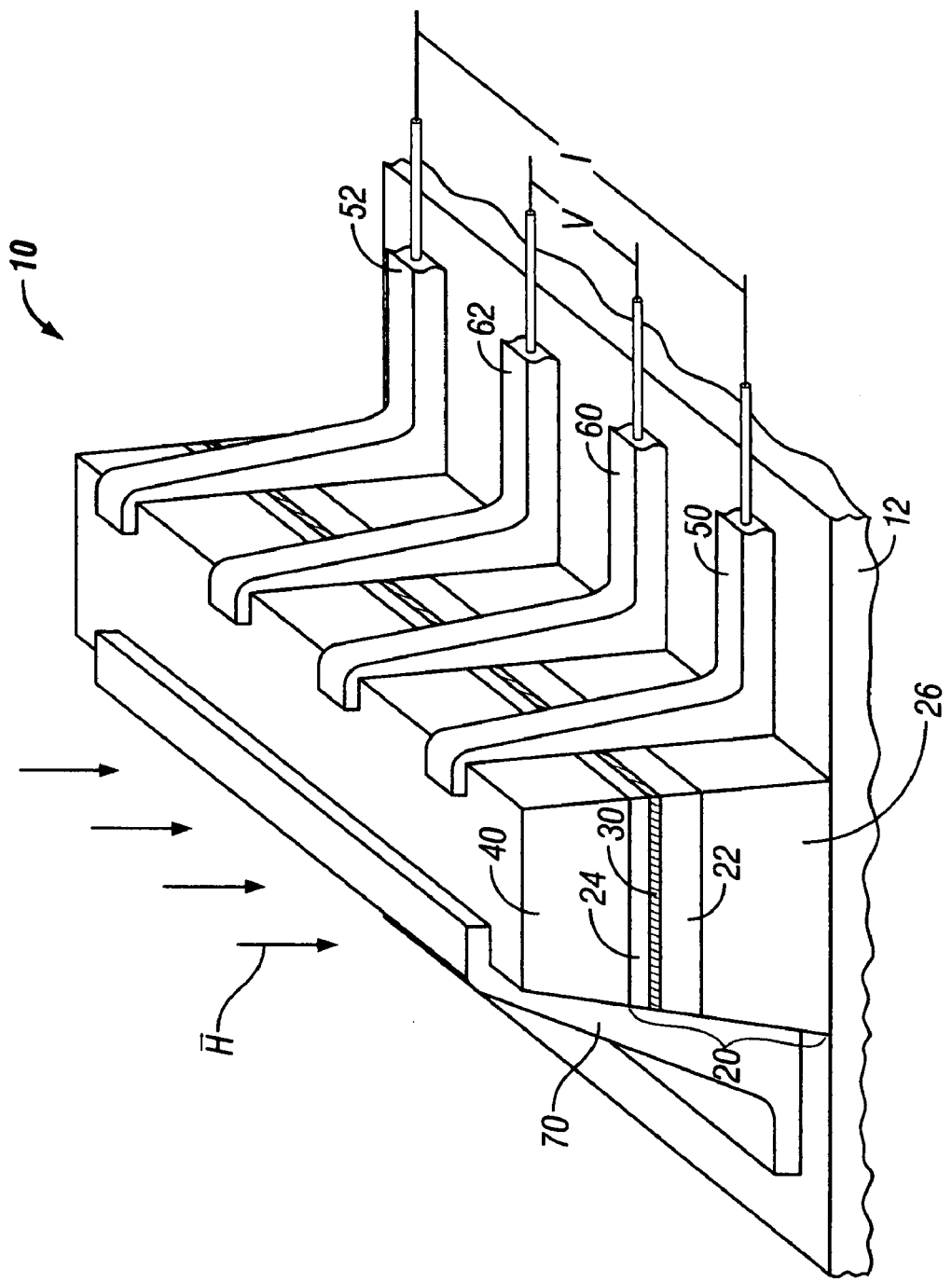
FIG. 1 is an isometric view of the prior art EMR sensor.

FIG. 1 is an isometric view of the prior art EMR sensor 10. The EMR sensor 10 includes a structure 20 that is a III–V heterostructure formed on a semiconducting substrate 12 such as GaAs. However, the EMR sensor described in this invention is not restricted to III–V semiconductor materials. For example, it may also be formed on the basis of silicon. The heterostructure 20 is a mesa above substrate 12 that results from a subtractive process, such as reactive-ion-etching (RIE). The heterostructure 20 includes a first layer 22 of semiconducting material having a first band-gap, a second layer 30 of semiconducting material formed on top of the first layer 22 and having a second band gap smaller than the first band gap, and a third layer 24 of semiconducting material formed on top of the second layer 30 and having a third band gap greater than the second band gap. The materials in first and third layers 22, 24 may be similar or identical. An energetic potential well (quantum well) is created by the first, second and third semiconducting material layers due to the different band-gaps of the different materials. Thus carriers can be confined inside layer 30, which is considered the EMR active layer in the sensor 10.

The first layer 22 is typically formed on top of a buffer layer 26 that may be one or more layers. The buffer layer 26 comprises several periods of a superlattice structure that function to prevent impurities present in the substrate from migrating into the functional layers 22, 24 and 30. In addition, the buffer layer 26 is chosen to accommodate the typically different lattice constants of the substrate 12 and the functional layers of the heterostructure 20 to thus act as a strain relief layer between the substrate and the functional layers.

One or more doped layers are incorporated into the semiconducting material in the first layer 22, the third layer 24, or both layers 22 and 24, and spaced apart from the boundary of the second and third semiconducting materials. The doped layers provide electrons (if n-doped) or holes if (p-doped) to the quantum well. The electrons or holes are concentrated in the quantum well in the form of a two-dimensional electron-gas or hole-gas, respectively.

As described in the previously-cited references, the layers 22/30/24 may be a $Al_{0.09}In_{0.91}Sb/InSb/Al_{0.09}In_{0.91}Sb$ heterostructure grown onto a semi-insulating GaAs substrate 12 with a buffer layer 26 in between. InSb is a narrow band-gap semiconductor. Narrow band-gap semiconductors typically exhibit high electron mobility, since the effective electron mass is greatly reduced. Typical narrow band-gap materials are InSb and InAs. For example, the room temperature electron mobility of InSb and InAs are ~70,000 $cm^2/Vs$ and ~35,000 $cm^2/Vs$, respectively.

The bottom $Al_{0.09}In_{0.91}Sb$ layer 22 formed on the buffer layer 26 has a thickness in the range of approximately 1–3 microns and the top $Al_{0.09}In_{0.91}Sb$ layer 24 has a thickness in the range of approximately 10 to 1000 nm, typically 50 nm. The doping layers incorporated into layer 22 or 24 have a thickness from one monolayer (delta-doped layer) up to 10 nm. The doping layer is spaced from the $InSb/Al_{0.09}In_{0.91}Sb$ boundaries of first and second or second and third semiconducting materials by a distance of 10–300 Å. The preferred doping is n-doping since electrons typically have higher mobility than holes. The typical n-dopant is silicon with a concentration in the range of 1 to $10^{19}/cm^3$. The deposition process for the heterostructure 20 is preferably molecular-beam-epitaxy, but other epitaxial growth methods can be used.

A capping layer 40 is formed over the heterostructure 20 to protect the device from corrosion. The capping layer is formed of an insulating material such as oxides or nitrides of aluminum or silicon (e.g., $Si_3N_4$, $Al_2O_3$) or a non-corrosive semi-insulating semiconductor.

Two current leads 50, 52 and two voltage leads 60, 62 are patterned over one side of the mesa of EMR structure 20 so that they make electrical contact with the quantum well. A metallic shunt 70 is patterned on the side of the mesa opposite the current and voltage leads of the EMR structure 20 so that it makes electrical contact with the quantum well. The applied magnetic field H, i.e., the magnetic field to be sensed, is shown by the arrows and is normal to the plane of the films in the EMR structure 20. The leads are comprised of metallic material; for example In, Au or alloys like AuGe or AuSn to provide an ohmic or low Schottky barrier contact between the lead material and the semiconductor. The leads are typically formed after formation of the capping layer 40, and sometimes after removal of some of the capping layer material.

Figure 2:
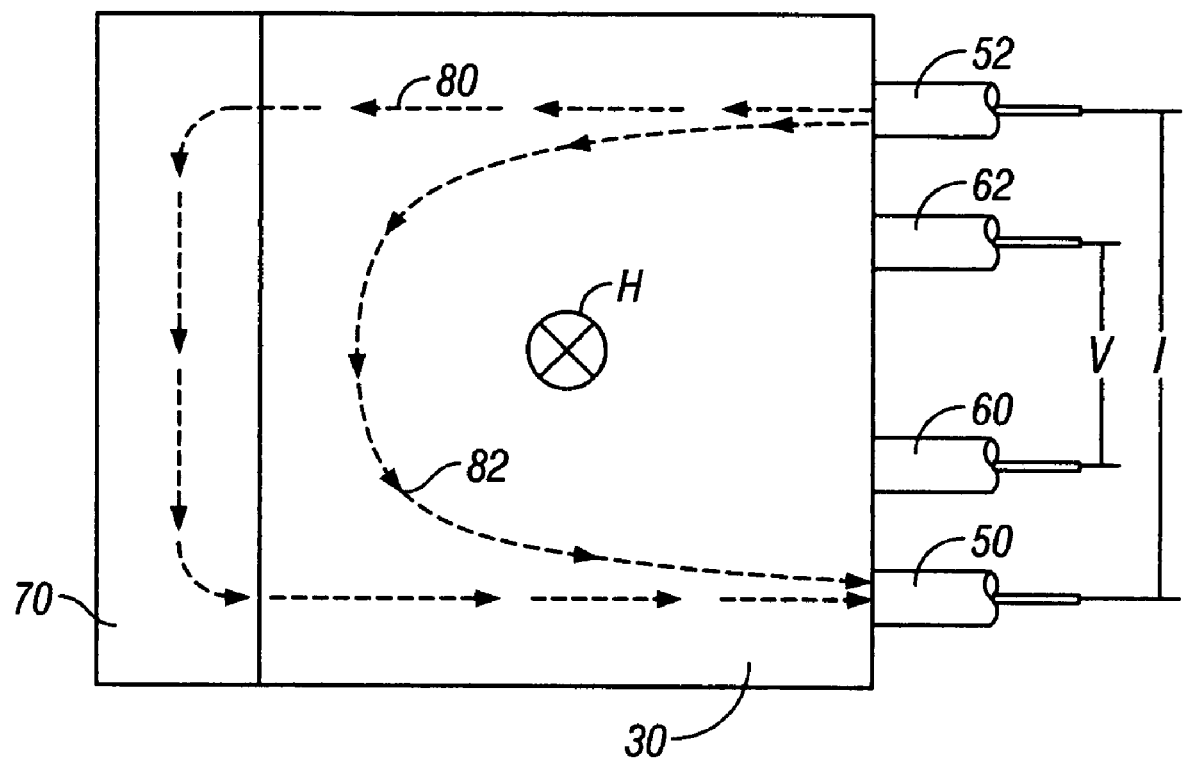
FIG. 2 is a top schematic view of the prior art EMR sensor of FIG. 1 through a section of the EMR active layer illustrating the basic operation of the sensor.

FIG. 2 is a top schematic view of the EMR sensor 10 through a section of active layer 30 and will illustrate the basic operation of the sensor. In the absence of an applied magnetic field H, sense current through leads 50, 52 passes into the semiconductor active layer 30 and is shunted through shunt 70, as shown by line 80. When an applied magnetic field H is present, as shown by the arrow tail into the paper in FIG. 2, current is deflected from shunt 70 and passes primarily through the semiconductor active layer 30, as shown by line 82. The change in electrical resistance due to the applied magnetic field is detected across the voltage leads 60, 62.

The EMR sensor described above is difficult to fabricate. The lithography for shunt 70 and the leads 50, 52, 60, 62 must be done on a nonplanar surface, i.e, the sides of the mesa, so that electrical contact can be made with the exposed edges of the EMR active layer 30. In particular deposition at an angle through a shadow mask has been employed in the prior art.

The Invention

Figure 3A:
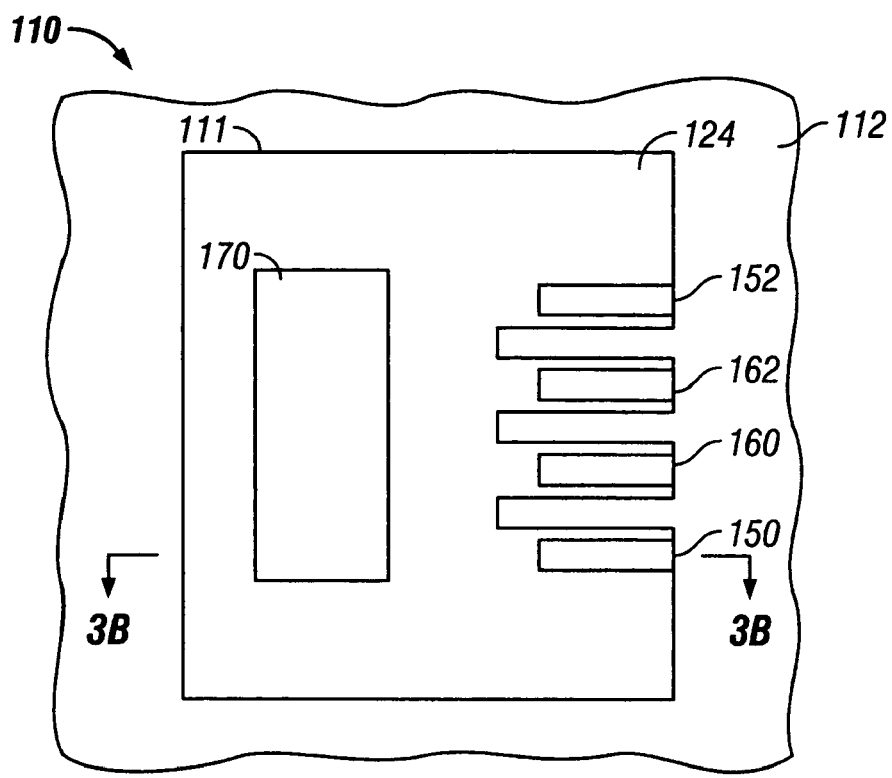
FIG. 3A is a top view of the planar EMR sensor according to this invention.
Figure 3B:
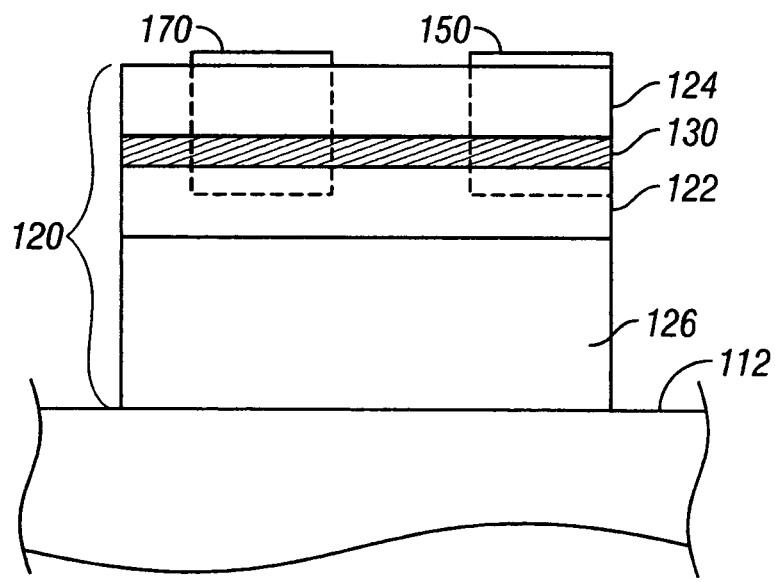
FIG. 3B is a side sectional view of section B—B of FIG. 3A illustrating the shunt regions and lead regions extending into the EMR active region of the planar EMR sensor according to this invention.

The invention is a planar EMR sensor 110 as represented by FIGS. 3A–3B. FIG. 3A is a top view showing the outline 111 of the sensor 110 formed on semiconductor substrate 112. A lithographic pattern defining windows for shunt region 170 and lead regions 150, 152, 160, 162 is formed on top of the multilayer structure. If capping material is present it first has to be removed by reactive ion etching (RIE), ion milling, plasma-etching, or wet-etching so that third semiconducting layer 124 is exposed in the window region. Electrically conductive material is then deposited into the defined windows to make contact with third semiconducting layer 124. It will remain in these regions after subsequent liftoff.

The electrically conductive material for the shunt and leads is any material with high electrical conductivity and the ability to make an ohmic contact or a very low height Schottky barrier resulting in low contact resistance. After the electrically conductive material for the shunt 170 and leads, such as lead 150, has been formed on third layer 124, it is brought into contact with EMR active layer 130 by a rapid thermal annealing process, which causes the material to diffuse downward through the layers making electrical contact with the EMR active layer 130. This is shown by the dashed lines in FIG. 3B, which is a sectional view of the planar EMR sensor 110 taken through section B—B of FIG. 3A that includes the shunt region 170 and lead 150 and shows the heterostructure 120. The heterostructure 120 includes first, second ant third semiconducting material layers 122, 130, 124, respectively, formed on buffer layer 126.

The most common approach to fabricating ohmic contacts on GaAs or other III–V semiconductors such as InSb or InAs is to apply an appropriate metallization to the wafer in a desired pattern and then alloy the metal into the III–V semiconductor by rapid thermal annealing. During the process a component of the metal enters into the III–V semiconductor and highly dopes the surface layer. Candidate species for doping are Si, Ge, Sn, and Te for n-type and Zn, Cd, Be, and Mg for p-type III–V materials. Au and Au alloys, preferably a AuGe, or AuSn alloy, are the most common and preferred materials for ohmic contact fabrication on n-type materials. A typical contact resistance area product for an ohmic contact is in the range of 1E-7 to 1E-6 $Ohm \cdot cm^2$.

If AuGe is used it is applied in proportions that represent a eutectic alloy (88% Au and 12% Ge by weight). This eutectic melts at 360° C. and thus any thermal annealing is carried out at temperatures exceeding 360° C. Other elements may be added to wet the alloy and prevent it from clustering up during the annealing process. Ni, Ag, or Lu are common choices of wetting agents for AuGe and may be either added to the alloy or applied before or after applying the AuGe layer. Ni is also known to enhance the diffusivity of Ge or other dopants into the III–V semiconductor. The resulting contact after annealing is then an alloy comprising AuGeX, where X=Ni, Ag or Lu.

The contact metal may be applied by e-beam or thermal evaporation, sputtering or other common thin film techniques known in the semiconductor industry. The wetting layer of Ni, Ag, or Lu may also be deposited by e-beam evaporation, thermal evaporation or sputtering. Approximately 25–30 nm of Ni are used for every 100 nm of AuGe. The exact thickness of the AuGe is not critical; however 50–250 nm is preferred. Much thinner layers of AuGe will typically result in higher contact resistance. Alloyed AuGeX (X=Ni, Ge, or Lu) generally has poor sheet resistance and thus an extra layer of Au may be added on top of the lead structures to form a AuGeX/Au multilayer with a reduced lead sheet resistance. In addition to Au as one of the layers in the multilayer structure, other materials may be used to lower lead sheet resistance, including Cu, Ag, Pt, or Pd.

In addition to Au and Au alloys, other materials suitable for the final lead and shunt are In or alloys of Ag, In, Pt, Pd, Sn, and Ti, such as alloys of AgIn, AgSn, AgInGe, TiPd, PdGe, SnNi, and SnSb.

The diffusion properties of various materials in various semiconducting materials are well known in the semiconducting manufacturing industry. In addition, the time and temperature to assure the desired electrical conductivity for a particular material can be determined experimentally by electrical measurement of various samples. In one example, if Au is used as the electrically conductive material and is formed by sputtering or evaporation to a thickness of approximately 10 microns on third layer 124 of InSb, then heating the structure to a temperature of approximately 500° C. for a very short time, e.g., a few milliseconds to a few seconds, will cause doping material to diffuse into contact with EMR active layer 130.

The leads 150, 152, 160, 162 and shunt 170 are spaced far enough apart on layer 124 to assure they are electrically isolated, i.e., there is no electrical contact between either lead and the shunt after the diffusion process. To define the sensor outline a mesa structure is formed as shown by outline 111 in FIG. 3A. This is achieved lithographically by patterning the mesa and subsequent reactive ion etching. It is important that the leads are electrically isolated from each other so that no current is shunted. In particular, the second semiconducting layer 130 needs to be removed from between the leads. Although the leads are shown to be rectangular and of the same size, they may be flared out so that a larger contact area for the metal is provided. The larger the contact area between the lead metal and the semiconductor heterostructure the lower the contact resistance. This is a clear advantage over the sensor of the prior art where the contact resistance area is determined by the thickness of the EMR active layer and the width of the leads. For high resolution applications the EMR sensor dimensions including the width of the leads need to be small. Thus the sensor of the prior art can only be made with a high contact resistance resulting in a loss of signal-to-noise ratio. For example, assuming a contact resistance area product of 1E-7 Ohm·cm$^2$, a 20 nm thick EMR active layer, and the leads being 20 nm wide the contact resistance for a sensor of the prior art would be 25 kOhms for each lead. However if the planar approach is used and the contact area for the metal is about 20 nm wide and 500 nm long this resistance is reduced to 1 kOhm. Flaring the leads and contact area out in a trapezoidal shape will lower the contact resistance even further to about 50–100 Ohms.

The EMR sensor 110 can have its outline 111 defined either before or after the electrically conductive material is deposited and diffused to make an ohmic or low Schottky barrier contact to form the shunt 170 and leads 150, 152, 160, 162.

A capping layer (not shown) may be formed over the edges of the heterostructure 120 to prevent exposure of the sensor edges to the environment. Moreover the structure may be backfilled with an insulating material, such as Al-oxide and planarized by chemical-mechanical polishing (CMP). Then the leads are physically connected while still electrically isolated from each other.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. An extraordinary magnetoresistance (EMR) sensor comprising:
   a substrate;
   a first layer of semiconducting material having a first band-gap formed on the substrate, a second layer of semiconducting material formed on top of the first layer and having a second band gap smaller than the first band gap, and a third layer of semiconducting material formed on top of the second layer and having a third band gap greater than the second band gap; said first, second and third layers forming a quantum well and said second layer being the EMR active layer responsive to a magnetic field generally perpendicular to said second layer;
   a shunt region of electrically conductive material on top of said third layer and extending perpendicularly through said third layer into electrical contact with the EMR active layer; and
   at least four lead regions on top of said third layer and extending perpendicularly through said third layer into electrical contact with the EMR active layer.

2. The sensor of claim 1 wherein the material of the shunt region and lead regions comprises Au or a Au alloy.

3. The sensor of claim 2 wherein the material of the shunt region and lead regions comprises a AuGe alloy or a AuSn alloy.

4. The sensor of claim 3 wherein the AuGe alloy of the shunt region and lead regions further comprises Ni, Ag, or Lu.

5. The sensor of claim 1 wherein the material of the shunt region and lead regions comprises In or an alloy selected from the group consisting of a Ag-alloy, a In alloy, a Pt alloy, a Pd alloy, Sn alloy and a Ti alloy.

6. The sensor of claim 5 wherein the material of the shunt region and lead regions comprises an alloy selected from the group consisting of AgIn, AgSn, AgInGe, TiPd, PdGe, SnNi and SnSb.

7. The sensor of claim 1 wherein the material of the shunt region and lead regions comprises a multilayer, one of the layers in said multilayer being a material selected form the group consisting of Au, Cu, Ag, Pt and Pd.

8. The sensor of claim 1 further comprising a capping layer formed over the third layer.

9. The sensor of claim 8 wherein the capping layer is formed over the edges of the EMR active layer.

10. The sensor of claim 1 wherein said at least four lead regions comprise a pair of voltage leads and a pair of current leads.

11. The sensor of claim 1 wherein the lead regions are electrically isolated from each other.

12. The sensor of claim 1 wherein the lead regions are physically isolated from each other.

13. The sensor of claim 1 wherein an ohmic contact is formed between the lead material and the EMR active layer.

14. The sensor of claim 1 wherein an ohmic contact is formed between the lead material and the EMR active layer and having a contact resistance area product of less than 1E6 Ohm·cm$^2$.

15. The sensor of claim 1 wherein an ohmic contact is formed between the lead material and the EMR active layer, each lead having a contact resistance of less than 1 kOhm.

16. An extraordinary magnetoresistance (EMR) sensor comprising:
- a substrate;
- a first layer of semiconducting material having a first band-gap formed on the substrate, a second layer of semiconducting material formed on top of the first layer and having a second band gap smaller than the first band gap, and a third layer of semiconducting material formed on top of the second layer and having a third band gap greater than the second band gap; said first, second and third layers forming a quantum well and said second layer being the EMR active layer responsive to a magnetic field generally perpendicular to said second layer;
- a shunt region of electrically conductive material on top of said third layer and extending perpendicularly through said third layer into electrical contact with the EMR active layer, the shunt region comprising Au or a AuGe alloy; and
- at least four lead regions on top of said third layer and extending perpendicularly through said third layer into electrical contact with the EMR active layer, the lead regions comprising Au or a AuGe alloy.

17. The sensor of claim 16 wherein the shunt region and lead regions comprise a AuGeNi alloy.

18. The sensor of claim 16 wherein the shunt region and lead regions are formed as multilayers, one of the layers in said multilayers being Au.

19. The sensor of claim 16 further comprising a capping layer formed over the third layer.

20. The sensor of claim 16 wherein said at least four lead regions comprise a pair of voltage leads and a pair of current leads.

21. The sensor of claim 16 wherein the lead regions are electrically isolated from each other.

22. The sensor of claim 16 wherein the lead regions are physically isolated from each other.

23. The sensor of claim 16 wherein an ohmic contact is formed between the lead material and the EMR active layer, each lead having a contact resistance of less than 1 kOhm.

* * * * *